(12) United States Patent
Lee et al.

(10) Patent No.: US 7,982,226 B2
(45) Date of Patent: Jul. 19, 2011

(54) REFLECTION TYPE OPTICAL SENSOR DEVICE

(75) Inventors: Yongtak Lee, Gwangju (KR); Youngmin Song, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 0 days.

(21) Appl. No.: 12/468,664

(22) Filed: May 19, 2009

(65) Prior Publication Data

US 2009/0289266 A1 Nov. 26, 2009

(30) Foreign Application Priority Data

May 21, 2008 (KR) .................... 10-2008-0047166

(51) Int. Cl.
*H01L 31/12* (2006.01)
(52) U.S. Cl. .................. 257/80; 257/E31.109
(58) Field of Classification Search .............. 257/79, 257/80, 81, 82, 83, 84, 85, 98, 99, E31.001, 257/E31.095, E31.103, E31.108, E31.109
See application file for complete search history.

(56) References Cited

U.S. PATENT DOCUMENTS

| | | | |
|---|---|---|---|
| 4,605,943 A * | 8/1986 | Nakamura et al. | 257/84 |
| 5,648,979 A * | 7/1997 | Mun et al. | 372/50.21 |
| 2005/0237524 A1 * | 10/2005 | Kamei et al. | 356/318 |

* cited by examiner

*Primary Examiner* — Minh-Loan T Tran
*Assistant Examiner* — Kevin Quinto

(57) ABSTRACT

Provided is a reflection type optical sensor device including: a semiconductor light source being formed by providing a light emitting region on a predetermined region of a substrate; and a photo-detection element being integrated on the same substrate as the substrate where the semiconductor light source is formed to surround an outer circumferential surface of the semiconductor light source, and including a light receiving region. When the light emitted from the semiconductor light source is reflected by an external object, the photo-detection element may detect the light to sense the object. Through this, it is possible to reduce cost and ensure a small size. Also, the photo-detection element is constructed to surround the outer circumferential surface of the semiconductor light source, and thus more accurately detect the light.

9 Claims, 4 Drawing Sheets

[FIG. 1]
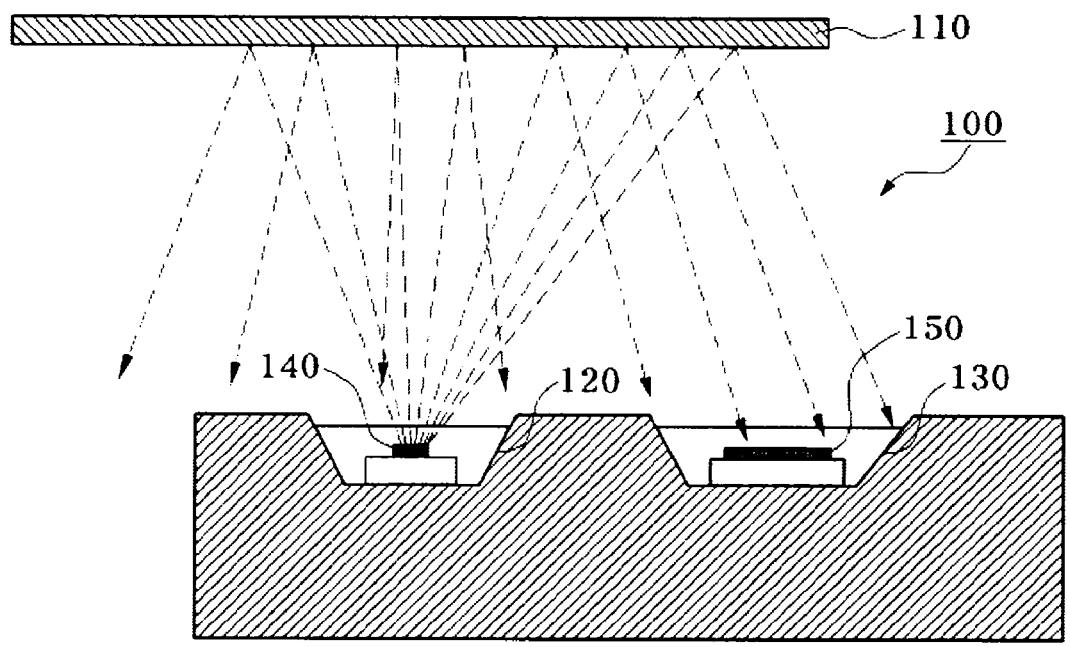

[FIG. 2a]
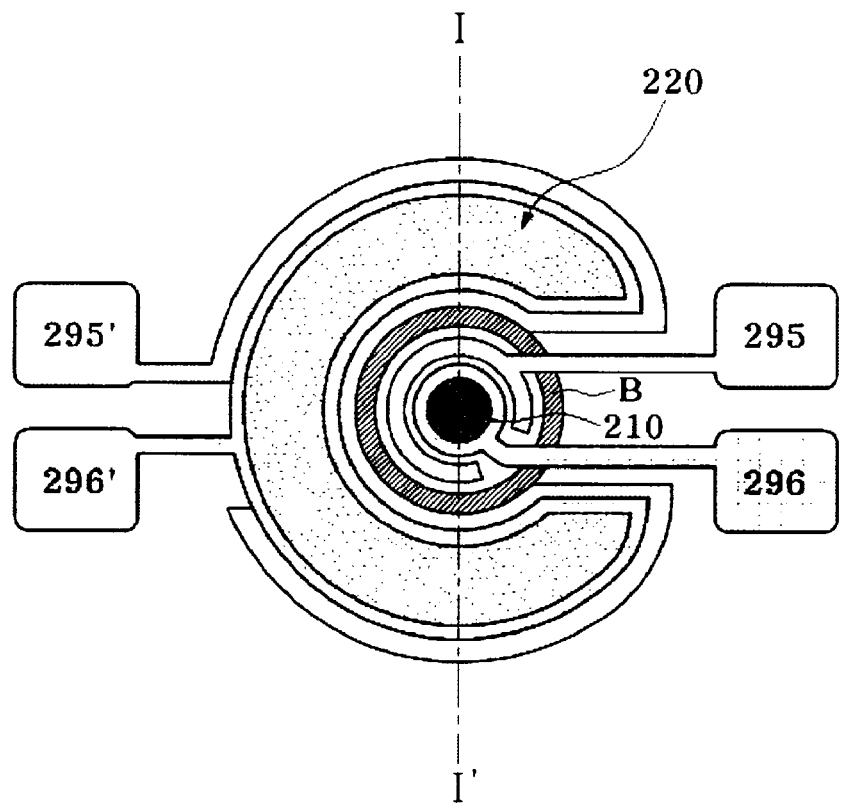
[FIG. 2b]
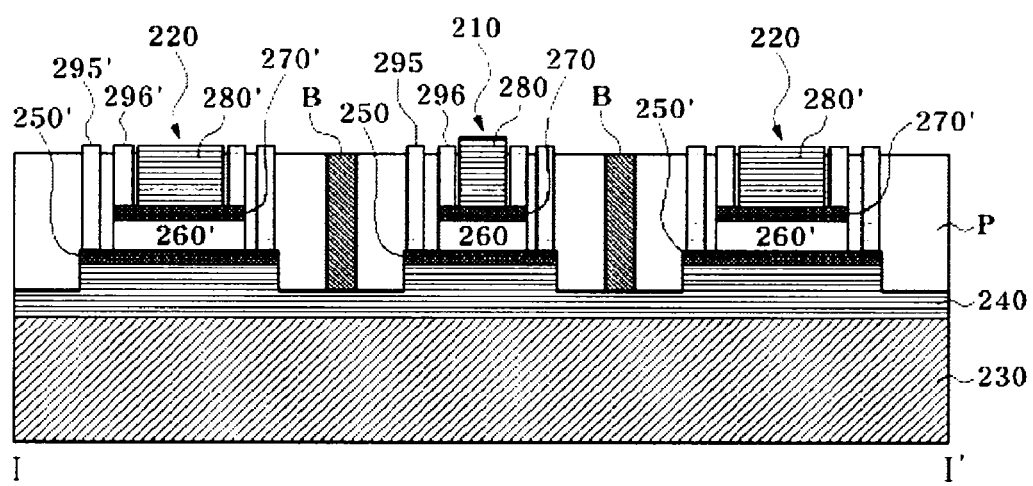

[FIG. 3a]
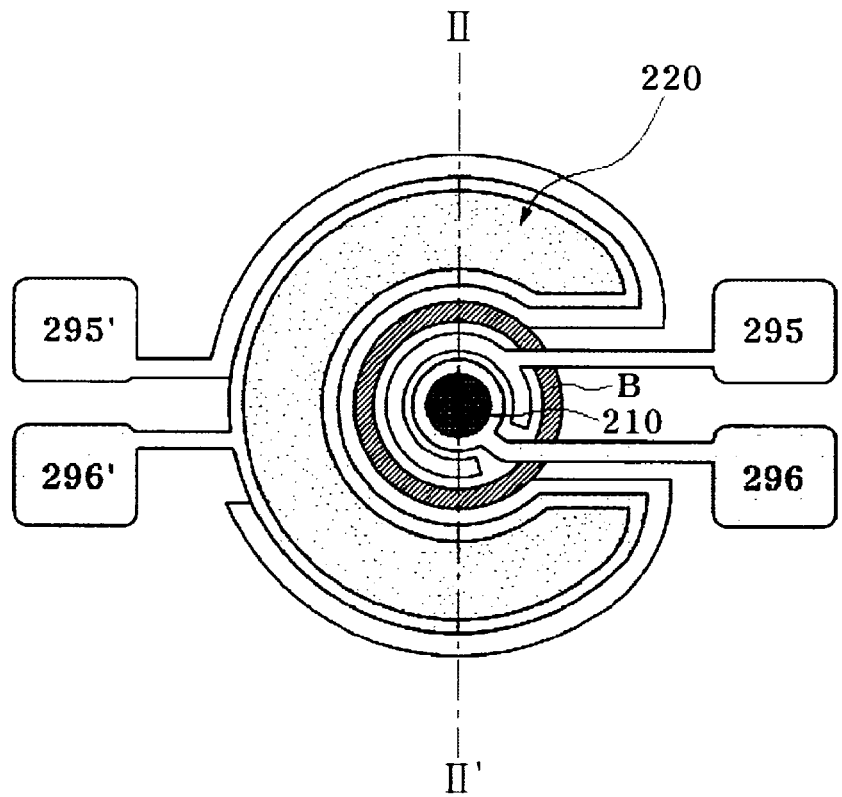
[FIG. 3b]
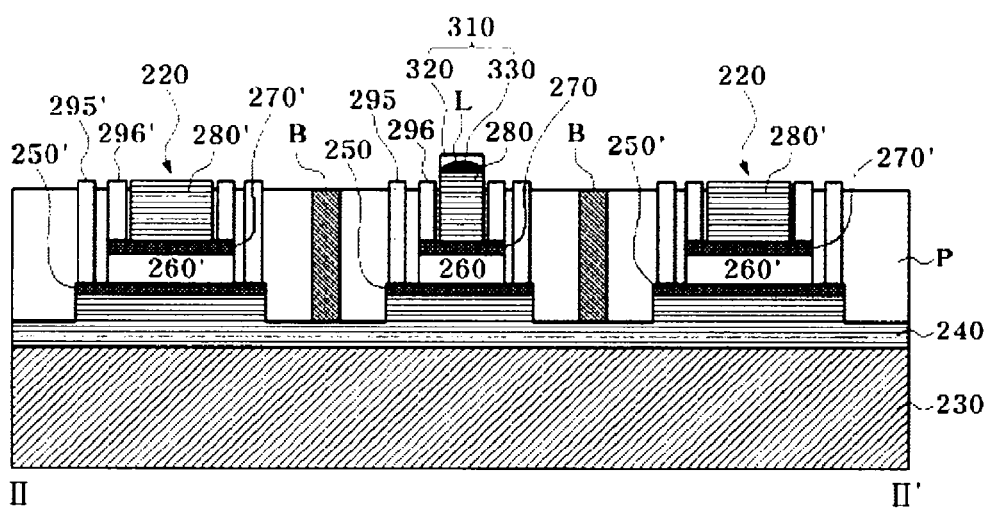

[FIG. 4a]
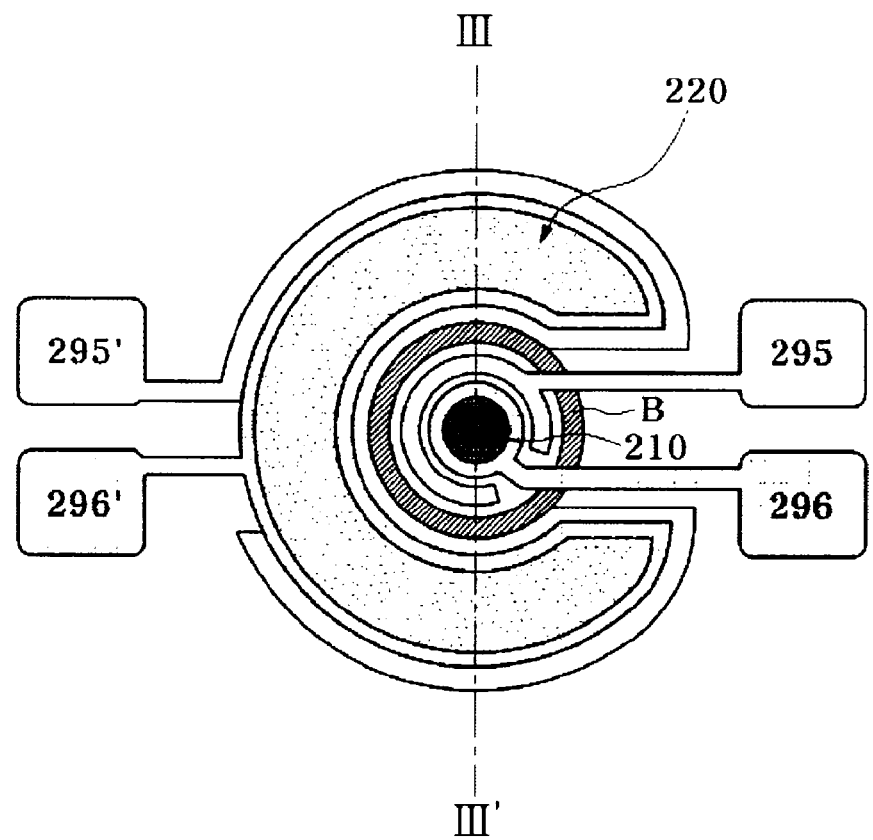
[FIG. 4b]
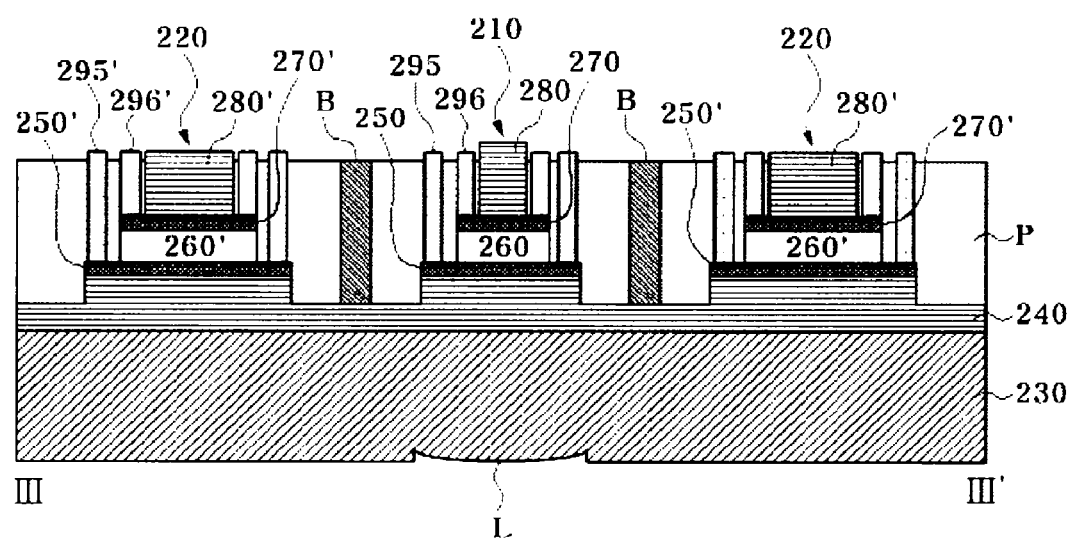

REFLECTION TYPE OPTICAL SENSOR DEVICE

BACKGROUND OF THE INVENTION

1. Field of the Invention

The present invention relates to a reflection type optical sensor device, and more particularly, to a reflection type optical sensor device that may integrate, on a single chip, a semiconductor light source and a photo-detection element that are used for a reflection type optical sensor device, in order to more accurately detect the light.

2. Description of the Related Art

Generally, a reflection type optical sensor includes a light emitter and a light receiver on the same side of an object for detection. The existence of the object may be detected when the light emitted from the light emitter is reflected from the surface of the object and is received by the optical receiver.

Known reflection type optical sensors include a light-emitting diode and an optical receiver installed within a cavity. However, the light of the light-emitting diode may cause an inaccurate detection due to its low intensity and excessive crosstalk.

Accordingly, a reflection type optical sensor using a vertical cavity surface emitting laser (VCSEL) is currently being used instead of the light-emitting diode.

FIG. 1 is a diagram illustrating a reflection type optical sensor device according to a related art. As a known patent applying the reflection type optical sensor device of FIG. 1, disclosed is the Korean Patent Publication No. 10-2007-0088573, titled "combined laser transmitter and photo-detector receiver package".

Referring to FIG. 1, the known reflection type optical sensor device 100 includes a reflection type sensor package with a first cavity 120 and a second cavity 130 in order to detect the existence and absence of an object 110. In order to emit the light, a VCSEL 140 is located within the first cavity 120, and an optical receiver 150 is located within the second cavity 130.

In this instance, the optical receiver 150 is constructed to receive at least one portion of the light that is emitted from the VCSEL 140 and is reflected from the object 110. When the reflected light exceeds a predetermined threshold, it is determined that the object 110 exists.

SUMMARY OF THE INVENTION

The light reflected from an object is not inclined to only one direction. Therefore, in the case of a known method where an optical receiver is provided in one direction only, it may cause an inaccurate detection.

Also, in the known method of separately providing a light emitter and an optical receiver, when a reflection type optical sensor device is installed in a compact portable device such as a mobile phone and the like, the volume of the reflection type optical sensor device may be enlarged and thus may be inapplicable.

The present invention has been finalized in order to solve the above-described problem, and thus provides a reflection type optical sensor device where a semiconductor light source with a light emitting region and a photo-detection element with a light receiving region are integrated on a single chip.

According to an aspect of the present invention, there is provided a reflection type optical sensor device including: a semiconductor light source being formed by providing a light emitting region on a predetermined region of a substrate; and a photo-detection element being integrated on the same substrate as the substrate where the semiconductor light source is formed, to surround an outer circumferential surface of the semiconductor light source, and including a light receiving region, wherein, when the light emitted from the semiconductor light source is reflected by an external object, the photo-detection element detects the light to sense the object.

In this instance, a blocking layer may be further provided in a predetermined region between the outer circumferential surface of the semiconductor light source and the photo-detection element.

Also, the semiconductor light sources may emit the light through an upper portion of the substrate using a top emission scheme.

Also, the semiconductor light source may emit the light through the rear of the substrate.

Also, a microlens may be further provided in a light emitting path of the semiconductor light source, and the microlens may be integrated in an upper portion of the semiconductor light source.

Also, a microlens may be further provided in a light emitting path of the semiconductor light source, and the microlens may be integrated in a lower portion of the substrate where the semiconductor light source is formed.

Also, the semiconductor light source may include a first distributed Bragg reflector, the light emitting region, and a second distributed Bragg reflector from the substrate. The photo-detection element may include the first distributed Bragg reflector, the light receiving region, and the second distributed Bragg reflector from the substrate.

According to a reflection type optical sensor device of the present invention, a semiconductor light source with a light emitting region and a photo-detection element with a light receiving region may be located on a single chip to thereby minimize the volume in the reflection type optical sensor device. Also, according to exemplary embodiments of the present invention, the photo-detection element may be provided to surround an outer circumferential surface of the semiconductor light source and thus may more accurately detect the light.

BRIEF DESCRIPTION OF THE DRAWINGS

FIG. 1 is a diagram illustrating a reflection type optical sensor device according to a related art;

FIG. 2A is a plan view for describing a reflection type optical sensor device according to an exemplary embodiment of the present invention;

FIG. 2B is a cross-sectional view cut along the I-I' line of FIG. 2A;

FIG. 3A is a plan view for describing a reflection type optical sensor device according to another exemplary embodiment of the present invention;

FIG. 3B is a cross-sectional view cut along the II-II' line of FIG. 3A;

FIG. 4A is a plan view for describing a reflection type optical sensor device according to still another exemplary embodiment of the present invention; and FIG. 4B is a cross-sectional view cut along the III-III' line of FIG. 4A.

DETAILED DESCRIPTION OF THE PREFERRED EMBODIMENTS

Reference will now be made in detail to exemplary embodiments of the present invention, examples of which are illustrated in the accompanying drawings, wherein like reference numerals refer to like elements throughout. Exemplary embodiments are described below to explain the present invention by referring to the figures.

FIG. 2A is a plan view for describing a reflection type optical sensor device according to an exemplary embodiment of the present invention, and FIG. 2B is a cross-sectional view cut along the I-I' line of FIG. 2A.

Referring to FIG. 2A, the reflection type optical sensor device according to an exemplary embodiment of the present invention may include a semiconductor light source 210 and a photo-detection element 220.

In FIG. 2A, the semiconductor light source 210 and the photo-detection element 220 are provided on the same substrate. The photo-detection element 220 may surround an outer circumferential surface of the semiconductor light source 210.

In this instance, a block layer B may be further provided within a predetermined space formed between the outer circumferential surface of the semiconductor light source 210 and the photo-detection element 220 in order to block a spontaneous emission light emitted from the semiconductor light source 210.

Specifically, the light emitted from the semiconductor light source 210 may include the spontaneous emission light and a simulated emission light. When the semiconductor light source 210 uses, for example, a semiconductor laser and the like, most of the light may be the simulated emission light and thus progress into the vertical direction, but the spontaneous emission light may also exist to some extents.

In this instance, when the spontaneous emission light enters a predetermined portion of the photo-detection element 220, noise may occur. Accordingly, there is a need to prevent the spontaneous emission light from entering the photo-detection element 220. For this, the blocking layer B may need to be additionally provided.

The blocking layer B may use, for example, a metal capable of absorbing the light, a polymer with a very weak permeability, and the like.

Referring to FIG. 2B, the reflection type optical sensor device according to an exemplary embodiment of the present invention may include, for example, a substrate 230, a first distributed Bragg reflector (DBR) 240, n-type ohmic contact layers 250 and 250', active layers (that is, a light emitting region and light receiving regions) 260 and 260', p-type ohmic contact layers 270 and 270', and second DBRs 280 and 280'.

Also, the reflection type optical sensor device according to an exemplary embodiment of the present invention may further include a polymer layer P that is formed using a scheme of exposing an opening of the emitted light and an opening of received light to thereby cover the entire structure of the reflection type optical sensor device, for example, by applying a resin such as polyimide and the like to the entire structure of the reflection type optical sensor device.

Here, the substrate 230 may use, as a semiconductor substrate, an n-type semiconductor substrate, preferably, for example, a GaAs or InP based compound semiconductor.

Also, when the reflection type optical sensor device according to an embodiment of the present invention is applicable, the type of substrate 230 is not particularly limited thereto. When necessary, for example, a glass substrate, a sapphire substrate, and the like may be used for the substrate 230.

The first DBR 240, and the second DBRs 280 and 280' may be provided so that at least two material layers with a different refractive index, for example, a material layer with a high refractive index and a material layer with a low refractive index may be alternatively layered while having a predetermined thickness.

The above first DBR 240 and the second DBRs 280 and 280' may adjust, for example, a reflection characteristic so that the light reflected from the light emitting region 260 may progress into an upper portion d or a lower portion of the first DBR 240 and the second DBRs 280 and 280'.

Also, the first DBR 240 and the second DBRs 280 and 280' may adjust an amount of light emitted through the upper portion or the lower portion by adjusting a reflection ratio through an addition to or a subtraction from the number of layers.

The light emitting region 260 denotes a region where a light emission occurs according to a recombination of electrons and holes that are supplied from a positive electrode and a negative electrode, respectively. The light emitting region 260 may be, for example, a bulk type, a semiconductor quantum well, a quantum dot, and the like.

Finally, n-type electrodes 295 and 295', p-type electrodes 296 and 296', and the blocking layers B are provided in a predetermined region of the polymer layer P, through a metal depositing process, a patterning process, and the like, after a selective etching process.

Hereinafter, an example of a method for manufacturing a reflection type optical sensor device according to an embodiment of the present invention will be described in detail with reference to FIG. 2B.

Referring to FIG. 2B, the substrate 230, for example, the n-type semiconductor substrate may be prepared by sequentially layering the first DBR 240, the n-type ohmic contact layers 250 and 250', the active layers (that is, the light emitting region and the light receiving region) 260 and 260', the p-type ohmic contact layers 270 and 270', and the second DBRs 280 and 280'.

Next, the second DBRs 280 and 280' may be selectively etched from an upper portion of the second DBRs 280 and 280'. The p-type ohmic contact layers 270 and 270', and the active layers 260 and 260' may be selectively etched. Next, the n-type ohmic contact layers 250 and 250', and the first DBR 240 may be selectively etched.

Next, the polymer layer P may be formed using a scheme of exposing an opening of light emission and an opening of light receiving from the entire structure manufactured as above to thereby cover the entire structure of the reflection type optical sensor device, for example, by applying a resin such as polyimide and the like to the entire structure of the reflection type optical sensor device.

Next, when a predetermined region of the polymer layer P is selectively etched and then the n-type electrodes 295 and 295', the p-type electrodes 296 and 296', and the blocking layers B are formed through the metal depositing process and the patterning process, then the reflection type optical sensor device according to an embodiment of the present invention is completed.

In the reflection type optical sensor device constructed as above, the semiconductor light source 210 and the photo-detection element 220 may be integrated on a single chip. Unlike the related art shown in FIG. 1, no cavity exists between the semiconductor light source 210 and the photo-detection element 220.

Also, the photo-detection element 220 may surround the outer circumferential surface of the semiconductor light source 210, and thus may more effectively detect the light reflected from an object.

In this instance, the semiconductor light source 210 may be configured using a top emission scheme, that is, a scheme of emitting the light through an upper portion of the substrate 230, or a scheme of emitting the light through a lower portion of the substrate 230.

FIG. 3A is a plan view for describing a reflection type optical sensor device according to another exemplary embodiment of the present invention, and FIG. 3B is a cross-sectional view cut along the II-II' line of FIG. 3A.

Referring to FIGS. 3A and 3B, the reflection type optical sensor device according to another exemplary embodiment of the present invention may include a first DBR 240, n-type ohmic contact layers 250 and 250', active layers (that is, a light emitting region and light receiving regions) 260 and 260', p-type ohmic contact layers 270 and 270', second DBRs 280 and 280', n-type electrodes 295 and 295', p-type electrodes 296 and 296', and blocking layers B that are provided on a substrate 230, for example, an n-type semiconductor substrate.

Also, the reflection type optical sensor device according to another exemplary embodiment of the present invention may further include a polymer layer P that is formed using a scheme of exposing an opening of light emission and an opening of light receiving to thereby cover the entire structure of the reflection type optical sensor device, for example, by applying a resin such as polyimide and the like to the entire structure of the reflection type optical sensor device.

Describing the difference between the reflection type optical sensor device according to another exemplary embodiment of the present invention and the reflection type optical sensor device described above with reference to FIGS. 2A and 2B, a microlens L is integrated in an upper portion of the semiconductor light source 210 as shown in FIGS. 3A and 3B.

In this instance, the microlens L may be selectively integrated in the upper portion of the semiconductor light source 210, which may be easily performed in the manufacturing operation of the reflection type optical sensor. Also, the manufacturing method of the microlens L is not particularly limited and thus may be performed using various types of schemes.

For example, the microlens L may be manufactured using a method disclosed in Korean Patent Publication No. 10-2006-0043912, titled "Method for Manufacturing Microlens Integrated Optoelectronic Device", or Korean Patent Publication No. 10-2007-0055764, titled "Method for Fabricating Micro-lens and Micro-lens Integrated Optoelectronic Devices Using Selective Etch of Compound Semiconductor", filed by the same inventor of this invention.

Further, with reference to the method disclosed in Korean Patent Publication No. 10-2006-0043912, titled "Method for Manufacturing Microlens Integrated Optoelectronic Device", as an example of a method for manufacturing the microlens L, the first DBR 240, the n-type ohmic contact layers 250 and 250', the active layers (that is, the light emitting region and the light receiving region) 260 and 260', the p-type ohmic contact layers 270 and 270', and the second DBRs 280 and 280' may be sequentially layered on the substrate 230, for example, the n-type semiconductor substrate as shown in FIG. 3B.

Next, a probable compound semiconductor oxide layer 310 is formed in order to manufacture the microlens L, for example, while gradually increasing a ratio of aluminum.

Next, when the oxidization is performed at a high temperature, a portion 320 where the ratio of aluminum is high may be oxidized whereby a refractive index decreases. A portion 330 where the ratio of aluminum is low may remain in an original compound semiconductor state and thereby have a high refractive index. As a result, portions 320 and 330 may function as a lens to form the microlens L.

In this instance, a focal distance of the microlens L may be changed by adjusting, for example, an oxidization time, a temperature, a growth condition of a possible oxide layer, and the like.

FIG. 4A is a plan view for describing a reflection type optical sensor device according to still another exemplary embodiment of the present invention, and FIG. 4B is a cross-sectional view cut along the III-III' line of FIG. 4A.

Referring to FIGS. 4A and 4B, the reflection type optical sensor device according to still another exemplary embodiment of the present invention may include a first DBR 240, n-type ohmic contact layers 250 and 250', active layers (that is, a light emitting region and light receiving regions) 260 and 260', p-type ohmic contact layers 270 and 270', second DBRs 280 and 280', n-type electrodes 295 and 295', p-type electrodes 296 and 296', and blocking layers B that are provided on a substrate 230, for example, an n-type semiconductor substrate.

Also, the reflection type optical sensor device according to still another exemplary embodiment of the present invention may further include a polymer layer P that is formed using a scheme of exposing an opening of emitted light and an opening of received light to thereby cover the entire structure of the reflection type optical sensor device, for example, by applying a resin such as polyimide and the like to the entire structure of the reflection type optical sensor device.

Describing the difference between the reflection type optical sensor device according to still another exemplary embodiment of the present invention and the reflection type optical sensor device described above with reference to FIGS. 2A and 2B, a microlens L is integrated in a lower portion of the substrate 230 as shown in FIGS. 4A and 4B.

The above structure shown in FIGS. 4A and 4B is different from the structure of the reflection type optical sensor device described above with reference to FIGS. 3A and 3B.

Specifically, the microlens L is provided in the upper portion of the semiconductor light source 210 in FIGS. 3A and 3B, whereas the microlens L is provided in the lower portion of the substrate 230, that is, the lower portion of the substrate 230 where the semiconductor light source 210 is formed in FIGS. 4A and 4B.

FIGS. 2A to 3B illustrate a case where the light emitted from the semiconductor light source 210 is emitted through the upper portion of the substrate 230. FIGS. 4A and 4B illustrate a case where the light emitted from the semiconductor light source 210 is emitted through a bottom surface of the substrate 230.

Accordingly, the semiconductor light source 210 of FIGS. 4A and 4B has a structural difference from the semiconductor light source 210 of FIGS. 2A through 3B in order to emit the light through the bottom surface of the substrate 230.

For example, the first DBR 240 and the second DBRs 280 and 280' may adjust each reflection characteristic so that the light emitted from the light emitting region 260 may progress into the lower portion of the substrate 230.

A scheme of forming the microlens L in the lower portion of the substrate 230 may use, for example, a reflow scheme, and the like.

In order to form the microlens L in the lower portion of the substrate 230 through the reflow scheme, a desired size of a cylindrical photoresist pattern may be formed in the lower portion of the substrate 230, for example, using a photo lithography scheme, and the like.

Next, when the cylindrical photoresist pattern is heated and is reflowed, the cylindrical photoresist may become thinner while approaching an edge region from a central axis due to a surface tension and thereby may be changed into a convex lens having a radius of curvature.

Next, when the photoresist in the lens form is etched using a mask, for example, a dry etching scheme, and the like, the microlens L may be formed in a predetermined region of the lower portion of the substrate 230, that is, in the lower portion of the substrate 230 where the semiconductor light source 210 is formed.

When the light emitted from the light emitting region 260 of the semiconductor light source 210 is emitted through an opening, the emitted light is enabled to progress via the microlens L. Through this, it is possible to decrease a beam divergence.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A reflection type optical sensor device comprising:
   a semiconductor light source being formed by providing a light emitting region on a predetermined region of a substrate; and
   a photo-detection element formed on the substrate spaced apart from the semiconductor light source, the photo-detection element comprising a light receiving region, wherein the photo-detection element surrounds an outer circumferential surface of the semiconductor light source, the semiconductor light source and the photo-detection element defining a space therebetween; and
   a blocking structure formed within and substantially filling the space defined between the semiconductor light source and the photo-detection element, the blocking structure including a blocking layer,
   wherein the photo-detection element is configured to sense an external object when light emitted from the semiconductor light source is reflected by the external object.

2. The reflection type optical sensor device of claim 1, wherein the blocking layer is configured to prevent a spontaneous light emission emitted from the semiconductor light source from entering the photo-detection element.

3. The reflection type optical sensor device of claim 1, wherein the semiconductor light source emits the light through an upper portion of the substrate using a top emission scheme.

4. The reflection type optical sensor device of claim 1, wherein the semiconductor light source emits the light through the rear of the substrate.

5. The reflection type optical sensor device of claim 1, wherein a microlens is further provided in a light emitting path of the semiconductor light source, and the microlens is integrated in an upper portion of the semiconductor light source.

6. The reflection type optical sensor device of claim 1, wherein a microlens is further provided in a light emitting path of the semiconductor light source, and the microlens is integrated in a lower portion of the substrate where the semiconductor light source is formed.

7. The reflection type optical sensor device of claim 1, wherein:
   the semiconductor light source comprises a first distributed Bragg reflector, the light emitting region, and a second distributed Bragg reflector from the substrate, and
   the photo-detection element comprises the first distributed Bragg reflector, the light receiving region, and the second distributed Bragg reflector from the substrate.

8. The reflection type optical sensor device of claim 1, wherein the semiconductor light source and the photo-detection element are integrated on a single chip.

9. The reflection type optical sensor device of claim 1, wherein substantially no cavity exists between the semiconductor light source and the photo-detection element.

* * * * *